(12) United States Patent
Branch et al.

(10) Patent No.: US 10,515,674 B2
(45) Date of Patent: *Dec. 24, 2019

(54) DEVICES AND SYSTEMS TO REDUCE THE NUMBER OF MEMORY TYPE RANGE REGISTERS (MTRRS) USED TO MAP PROCESSOR-ASSOCIATED MEMORY

(71) Applicant: Intel Corporation, Santa Clara, CA (US)

(72) Inventors: Robert A. Branch, Portland, OR (US); Murugasamy K. Nachimuthu, Beaverton, OR (US); Sundar Muthusamy, Lexington, SC (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/926,837

(22) Filed: Mar. 20, 2018

(65) Prior Publication Data

US 2019/0096452 A1 Mar. 28, 2019

Related U.S. Application Data

(63) Continuation of application No. 15/089,370, filed on Apr. 1, 2016, now Pat. No. 9,922,689.

(51) Int. Cl.
*G06F 12/00* (2006.01)
*G11C 7/10* (2006.01)
(Continued)

(52) U.S. Cl.
CPC .......... *G11C 7/1072* (2013.01); *G06F 9/4401* (2013.01); *G06F 12/10* (2013.01); *G06F 13/16* (2013.01); *G06F 13/1694* (2013.01); *G11C 14/009* (2013.01); *G11C 14/0063* (2013.01); *G11C 14/0081* (2013.01); *G06F 2212/1044* (2013.01)

(58) Field of Classification Search
CPC .............. G11C 7/1072; G11C 14/0063; G11C 14/0081; G11C 14/009; G06F 9/4401; G06F 12/10; G06F 13/16; G06F 13/1694; G06F 2212/1044
See application file for complete search history.

(56) References Cited

U.S. PATENT DOCUMENTS

| | | |
|---|---|---|
| 6,408,384 B1 | 6/2002 | Adams |
| 7,055,015 B2 | 5/2006 | Shiota |

(Continued)

OTHER PUBLICATIONS

International search report for PCT application No. PCT/US2017/020541 filed Mar. 2, 2017; dated Jun. 6, 2017; 13 pages.

*Primary Examiner* — Mark A Giardino, Jr.
(74) *Attorney, Agent, or Firm* — Thorpe North & Western, LLP

(57) ABSTRACT

Technology for a system is described. The system can include one or more processors. The system can include a memory associated with the one or more processors. The system can include a memory controller comprising logic to create a reserved memory region in a system physical address (SPA) map. The memory controller can comprise logic to detect when the one or more processors are brought online. The memory controller can comprise logic to map the memory associated with the one or more processors that are brought online to the reserved memory region in the SPA map.

20 Claims, 7 Drawing Sheets

(51) Int. Cl.
*G06F 13/16* (2006.01)
*G06F 9/4401* (2018.01)
*G11C 14/00* (2006.01)
*G06F 12/10* (2016.01)
G06F 13/00 (2006.01)
G06F 13/28 (2006.01)

(56) References Cited

U.S. PATENT DOCUMENTS

2013/0254491 A1 9/2013 Coleman et al.
2013/0262736 A1 10/2013 Kegel et al.

DEVICES AND SYSTEMS TO REDUCE THE NUMBER OF MEMORY TYPE RANGE REGISTERS (MTRRS) USED TO MAP PROCESSOR-ASSOCIATED MEMORY

CROSS-REFERENCE TO RELATED APPLICATIONS

This application is a continuation of U.S. patent application Ser. No. 15/089,370, filed on Apr. 1, 2016, now issued as U.S. Pat. No. 9,922,689, which is incorporated herein by reference in its entirety.

BACKGROUND

Memory devices are typically provided as internal, semiconductor, integrated circuits in computers or other electronic devices. There are many different types of memory including volatile memory, for example, dynamic random access memory (DRAM), synchronous dynamic random access memory (SDRAM), and non-volatile memory, for example, flash memory.

Flash memory devices typically use a one-transistor memory cell that allows for high memory densities, high reliability, and low power consumption. Changes in threshold voltage of the cells, through programming of a charge storage node (e.g., a floating gate or charge trap) determine the data state of each cell. Other non-volatile memories such as phase change (PRAM) use other physical phenomena such as a physical material change or polarization to determine the data state of each cell. Common uses for flash and other solid state memories include personal computers, personal digital assistants (PDAs), digital cameras, digital media players, digital recorders, games, appliances, vehicles, wireless devices, cellular telephones, and removable portable memory modules among others. The uses for such memory continue to expand.

BRIEF DESCRIPTION OF THE DRAWINGS

Features and advantages of technology embodiments will be apparent from the detailed description which follows, taken in conjunction with the accompanying drawings, which together illustrate, by way of example, embodiment features; and, wherein.

Figure 1:
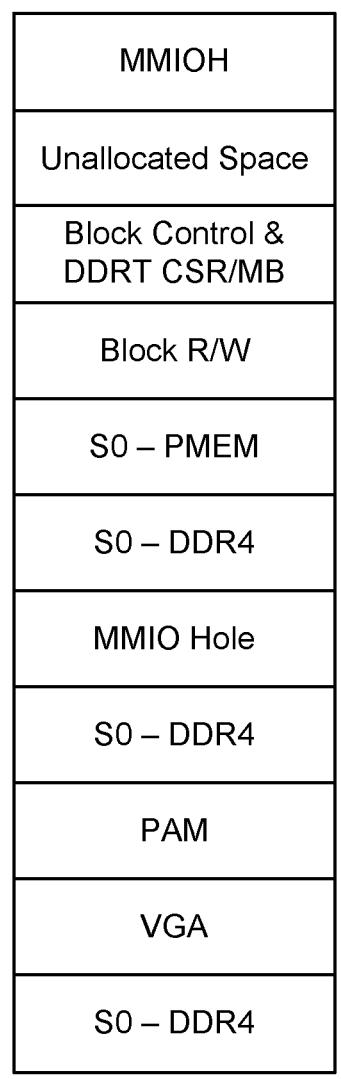
FIG. 1 illustrates a system physical address (SPA) map for a computing system in accordance with an example embodiment.

Reference will now be made to the exemplary embodiments illustrated, and specific language will be used herein to describe the same. It will nevertheless be understood that no limitation on disclosure scope is thereby intended.

DESCRIPTION OF EMBODIMENTS

Before the disclosed technology embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various embodiments. One skilled in the relevant art will recognize, however, that such detailed embodiments do not limit the overall inventive concepts articulated herein, but are merely representative thereof.

As used in this specification and the appended claims, the singular forms "a," "an" and "the" include plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

A memory map, such as a system physical address (SPA) map, is a table that indicates a layout or structure of a memory in a computing system. The memory map can reside within the memory. Each memory location within the SPA map can be associated with a physical address (or memory address) and data. In one example, during an initialization of the computing system (e.g., a boot process), the memory map can be passed on from a firmware to instruct an operating system kernel about the layout or structure of the memory. The memory map can include information regarding a size of total memory and available memory, information on reserved regions and/or other information specific to the architecture of the computing system.

In one example, the memory map can assign physical addresses to each memory location, such that data cannot be inadvertently overwritten or corrupted. In other words, the memory map can ensure that data is written to, and read from, correct memory locations. Without the memory map, or if an existing memory map is corrupted, the operating system kernel is more likely to write data to, and read data from, incorrect memory locations, which can cause file damage and corruption.

In one example, the memory map can include volatile memory or non-volatile memory (NVM). Examples of NVM include, but are not limited to, phase change memory (PCM), a three dimensional cross point (3D XPoint) memory, a resistive memory, nanowire memory, ferro-electric transistor random access memory (FeTRAM), flash memory such as NAND, and NOR memory, magnetoresistive random access memory (MRAM) memory that incorporates memristor technology, spin transfer torque (STT)-MRAM, and/or write in place non-volatile MRAM (NVMRAM).

In one configuration, the computing system can support one or more double data rate (DDR) dual in-line memory modules (DIMMs), such as DDR4 DIMMs. DDR4 is a type of synchronous dynamic random-access memory (SDRAM) with a high bandwidth ("double data rate") interface. The DDR DIMMs can be modules containing one or more DDR SDRAM memory chips on a circuit board. In such computing systems, when a processor is initialized or brought online, memory (e.g., DDR4 memory) for the processor can be added to a SPA map that already exists for the computing system. More specifically, the memory can be added at the top of a volatile memory range within the SPA map. The memory (e.g., DDR4 memory) can include a single volatile memory region that is mapped as write-back (WB) in the SPA map.

In one example, a processor online event is a capability to bring an additional processor online within a computing system that is already running and/or fully operational. When the computing system is started, a basic input/output system (BIOS) can initialize one of the multiple processors. Once an operating system (OS) boots on the computing system, a single processor can be available for user. At a later time, a use of a second processor can be desirable to the computing system. Therefore, the second processor can be brought online via coordination between the OS, the BIOS and hardware while the computing system is running and/or fully operational. After the second processor is brought online, the second processor is available for general usage by the OS.

However, some newer computing systems support DIMMs that do not only contain a single volatile memory region that is mapped to WB. One non-limiting example is newer computing systems that support a 3D XPoint non-volatile memory technology. In these newer computing systems, block read/write (R/W) regions associated with the memory (e.g., DDR4 memory) of the processor to be brought online can be mapped as WB in the SPA map. In addition, block control double data rate transport (DDRT) control and status register (CSR) or mailbox (MB) regions associated with the memory (e.g., the DDR4 memory) of the processor to be brought online can be mapped as uncached (UC) in the SPA map. In one example, the R/W regions and the block control/DDRT CSR/MB regions (or ranges) can be mapped in the SPA map above volatile or persistent memory regions (or ranges) in the SPA map, wherein the volatile or persistent memory regions are mapped as WB in the SPA map. In other examples, the UC region may not necessarily be above the WB region in the SPA map. For example, the ordering of regions in the SPA map can be WB/UC/WB or WB/UC/WB/UC, as long as within an MTRR limit.

In one example, the block R/W regions and the DDRT CSR/MB regions refer to different memory areas on the DIMM (e.g., a 3D XPoint DIMM). These memory areas can serve different purposes, and therefore, can have different memory type range registers (MTRR) attributes. In one example, the block R/W region is a set of registers for accessing part of a non-volatile memory space on the DIMMs (e.g., 3D XPoint DIMMs). The block R/W region acts as a window into the non-volatile memory space on the DIMM. In another example, the DDRT CSR/MB region is a set of control and communication registers on the DIMMs (e.g., 3D XPoint DIMMs).

In one example, the processor can support a limited number of memory type range registers (MTRRs). As a non-limiting example, the processor can support 14 MTRRs. The MTRRs are a set of processor supplementary capabilities control registers that can designate different portions of a physical address space for different usages (e.g., uncached (UC), write back (WB), write-through, write-combining or write-protect). These different usages can correspond to possible access modes to memory ranges in the SPA map. In other words, the MTRRs can indicate a handling of the memory in the computing system. The MTRRs can use a set of programmable model-specific registers (MSRs).

In various embodiments, a reserved memory region, such as a reserved non-existent memory (NXM) region, can be included in the SPA map. The reserved memory region can be used to pre-allocate the block R/W regions and the block control/DDRT CSR/MB regions to support processor online events. The processor online events can refer to when a processor is initialized and brought online, and memory (e.g., DDR4 memory) for the processor is added to the existing SPA map. In other words, the creation of the reserved memory region can essentially create an unused memory region in the SPA map, and the reserved memory region can act as a placeholder for memory to be added when a corresponding processor is brought online. The reserved memory region can be created using a DRAM rule. The DRAM rule is a hardware logic that provides the mapping of central processing unit (CPU) generated SPA to hardware that services the request. If there are multiple DIMMs or multiple processors, the DRAM rule provides a mapping of which SPA region is to be serviced by a particular DIMM or memory controller or processor socket. The hardware logic parameters can be programmed by the BIOS (or in some cases hardware can hard code or set values based on straps). In addition, the creation of the reserved memory region can minimize the use of MTTRs since the reserved memory region enables all WB regions to be grouped together in the SPA map and the reserved memory region enables all UC regions to be grouped together in the SPA map.

In one example, a computing system can include two processor sockets and two memory controllers. A memory riser (in which one or more DIMMs can be populated) can connect the one or more DIMMs to one memory controller. A user can boot the computing system with one processor socket and one processor socket and one memory riser, and after the computing system is booted and the OS is running, the user can add another memory riser with DIMMs. In this example, an NXM region can be reserved for a WB area and another NXM region can be reserved for a UC area. After the memory is added, a platform can detect the memory addition and a BIOS or firmware (FW) can initialize the memory and update SPA regions to include new memory and controller regions using the NXM region. The OS can be notified about the memory addition. At a later time, another processor socket can be added with or without a memory riser. An additional memory riser can be added to achieve additional memory capacity.

FIG. 1 illustrates an example of a system physical address (SPA) map 100 for a computing system. The computing system can be populated with a single socket. The computing system can operate in a one-level memory (1LM) configuration mode. In addition, the SPA map 100 can be for one or more dual in-line memory modules (DIMMs) installed in the computing system. As a non-limiting example, the DIMMs can support a three dimensional (3D) XPoint non-volatile memory technology.

As shown in FIG. 1, the SPA map 100 can include a Memory Mapped Input Output High (MMIOH) region, an unallocated region, a block control and double data rate transport (DDRT) control and status register (CSR) or mailbox (MB) region, a block read/write (R/W) region, a persistent memory (PMEM) region associated with a first processor (S0), a first memory region (e.g., DDR4 region) associated with the first processor (S0), a Memory Mapped Input Output (MMIO) hole, a second memory region (e.g., DDR4 region) associated with the first processor (S0), a Programmable Attribute Map (PAM) region, a Video Graphics Array (VGA) region, and a third memory region (e.g., DDR4 region) associated with the first processor (S0). The SPA map 100 does not include a reserved memory region, such as a reserved non-existent memory (NXM) region.

In one example, the memory regions (e.g., DDR4 regions) associated with the first processor (S0), the PMEM region and the block R/W region can be marked in the core MTRRs as 'write-back' (WB). In other words, the memory regions, the PMEM region and the block R/W region can be mapped as WB in the SPA map 100. In addition, the block control and DDRT CSR/MB region can be marked in the core MTTRs as 'uncached' (UC). In other words, the block control and DDRT CSR/MB region can be mapped as UC in the SPA map 100.

In one example, if a second processor containing memory (e.g., DDR4 memory) is initialized or brought online, a space or region in the SPA map 100 that is available for the memory (e.g., DDR4 memory), without relocating the block R/W region and the block control and DDRT CSR/MB region, is the unallocated region in the SPA map 100.

As previously explained, the SPA map 100 can be for a computing system with one or more DIMMs, such as 3D XPoint DIMMs. Since the SPA map 100 does not include a reserved memory region, such as an NXM region, when the second processor is brought online and memory (e.g., DDR4 memory) associated with the processor is added to the SPA map 100, the SPA map 100 can end up with multiple UC and WB regions. The multiple UC and WB regions can result due to a starting address for a DRAM decoder (N) being a limit address of the DRAM decoder (N−1).

Figure 2:
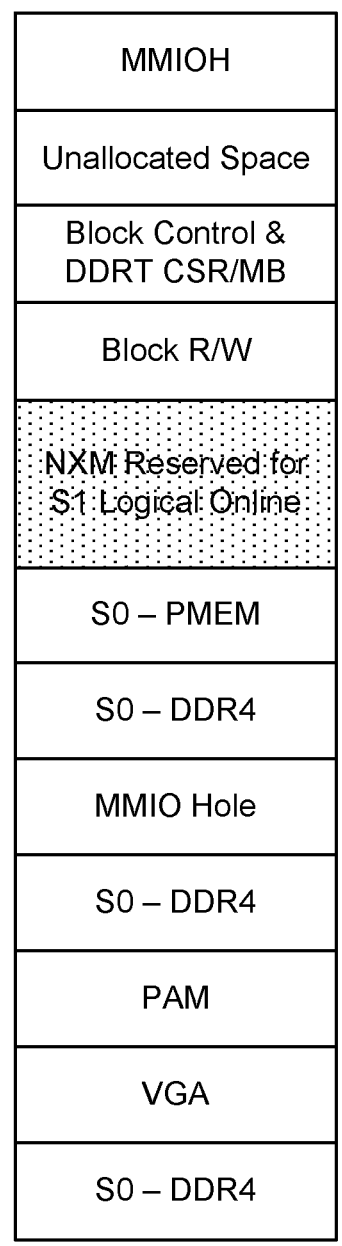
FIG. 2 illustrates a system physical address (SPA) map for a computing system and the SPA map includes a reserved memory region in accordance with an example embodiment.

FIG. 2 illustrates an example of a system physical address (SPA) map 200 for a computing system and the SPA map 200 includes a reserved memory region. The computing system can be populated with a single socket. The computing system can operate in a one-level memory (1LM) configuration mode. In addition, the SPA map 200 can be for one or more dual in-line memory modules (DIMMs) installed in the computing system. As a non-limiting example, the DIMMs can support a three dimensional (3D) XPoint non-volatile memory technology.

In addition to the reserved memory region (e.g., a reserved NXM region), the SPA map 200 can include a Memory Mapped Input Output High (MMIOH) region, an unallocated region, a block control and double data rate transport (DDRT) control and status register (CSR) or mailbox (MB) region, a block read/write (R/W) region, a persistent memory (PMEM) region associated with a first processor (S0), a first memory region (e.g., DDR4 region) associated with the first processor (S0), a Memory Mapped Input Output (MMIO) hole, a second memory region (e.g., DDR4 region) associated with the first processor (S0), a Programmable Attribute Map (PAM) region, a Video Graphics Array (VGA) region, and a third memory region (e.g., DDR4 region) associated with the first processor (S0).

In one example, the reserved memory region can be above the PMEM region and below the block R/W region in the SPA map 200. The reserved memory region is a reserved address range that enables processor online events. In other words, the reserved memory region enables a second processor to be brought online, and memory (e.g., DDR4 memory) for the processor can be allocated in the reserved memory region in the SPA map 200. Therefore, the reserved memory region can be for a second processor (S1). The reserved memory region can also support an addition of a third processor (S2), a fourth processor (S3), and so on. In one example, the reserved memory region can be created using an additional DRAM rule that is encoded as NXM. The reserved memory region can be appropriately sized to encompass a maximum amount of memory that can potentially be added to the SPA map 200 due to the addition of the one or more processors brought online.

In one example, NXM can act as a placeholder in the SPA map 200 for memory that does not actually exist. When the BIOS sets up memory address decoders for the computing system, the BIOS can mark a memory range as being non-existent in a memory controller. At a later time when the computing system is running/fully operational and a memory access (read or write) is decoded to a memory range that is marked as non-existent, the memory address decoder can take appropriate action (e.g., gracefully terminate the request, etc.).

In the example shown in FIG. 2, the SPA map 200 with the reserved memory region is illustrated prior to the second processor being brought online and prior to the memory associated with the second processor being mapped to the reserved memory region in the SPA map 200.

Figure 3:
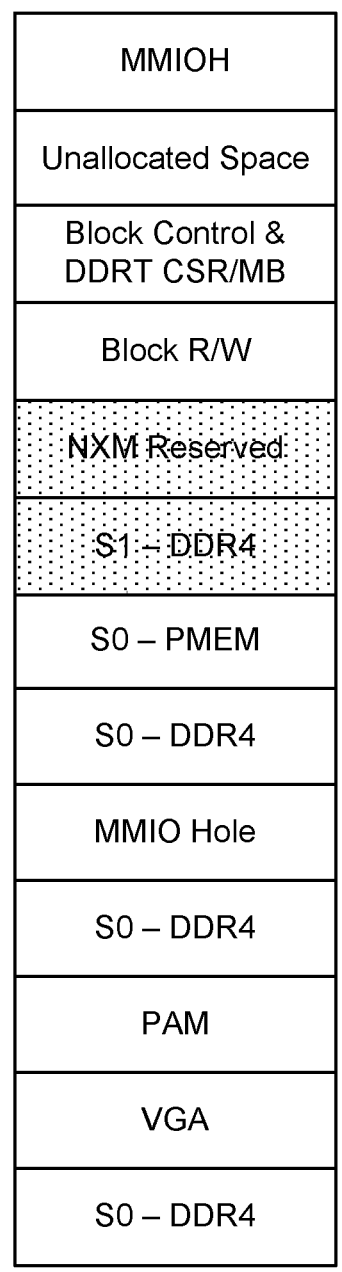
FIG. 3 illustrates a system physical address (SPA) map for a computing system and the SPA map includes a reserved memory region in accordance with an example embodiment.

FIG. 3 illustrates an example of a system physical address (SPA) map 300 for a computing system and the SPA map 300 includes a reserved memory region. The SPA map 300 can be for one or more dual in-line memory modules (DIMMs) installed in the computing system. As a non-limiting example, the DIMMs can support a three dimensional (3D) XPoint non-volatile memory technology. As shown in the example in FIG. 3, when a second processor is brought online, the SPA map 300 can be updated, such that memory (e.g., DDR4 memory) for the second processor can be mapped to the reserved memory region. As an example, the reserved memory region can be a reserved NXM region.

Due to the ability to map the memory (e.g., DDR4 memory) for the second processor brought online to the reserved memory region, the block R/W region (which is mapped as WB in the SPA map 300) and the block control DDRT CSR/MB region (which is mapped as UC in the SPA map 300) may not be moved in the SPA map 300. The non-movement of these regions within the SPA map 300 can result in several advantages. For example, as an advantage, the number of core MTRRs that are used can be minimized since the WB and UC regions in the SPA map 300 are contiguous. In other words, the reserved memory region can result in the WB regions being grouped together in the SPA map 300 and the UC regions being grouped together in the SPA map 300, which in turn reduces the number of MTRRs that are used for the SPA map 300.

As shown in FIG. 3, the SPA map 300 can include a MMIOH region, an unallocated region, a block control DDRT CSR/MB region, a block R/W region, a reserved memory region, a PMEM region associated with a first processor (S0), a first memory region (e.g., DDR4 region) associated with the first processor (S0), a MMIO hole, a second memory region (e.g., DDR4 region) associated with the first processor (S0), a PAM region, a VGA region, and a third memory region (e.g., DDR4 region) associated with the first processor (S0). In addition, a memory region (e.g., DDR4) region associated with a second processor (S1) can be mapped to the reserved memory region in the SPA map 300. The memory regions (e.g., DDR4 and PMEM) for the first and second processor, as well as the block R/W region, can be mapped to a continuous WB region (or range) in the SPA map 300. The block control DDRT CSR/MB region can be mapped to a continuous UC region (or range) in the SPA map 300. As another example (not shown in FIG. 3), the SPA map 300 can include a PMEM region associated with the second processor (S1), and the PMEM region can be mapped to the continuous WB region (or range) in the SPA map 300.

In one example, a BIOS can be used to determine the SPA map 300, and the BIOS can program details of the SPA map 300 in a memory controller. The memory controller can include programmable memory address decode logic. The memory controller can be requested to treat part of the SPA map 300 as NXM via BIOS programming. When a processor is brought online, the BIOS can reprogram the programmable memory address decode logic in the memory controllers, such that a NXM region size can be reduced and memory for the new processor is understood by the memory controller.

In one configuration, the SPA map 300 can be passed from a platform basic input/output system (BIOS) to an operating system via a legacy E820 or unified extended firmware interface (UEFI) memory mapping technique. The SPA map 300 can include the reserved memory region (also referred to as a memory hole). The reserved memory region can be utilized to map memory added by a new processor that is brought online in the computing system.

Figure 4:
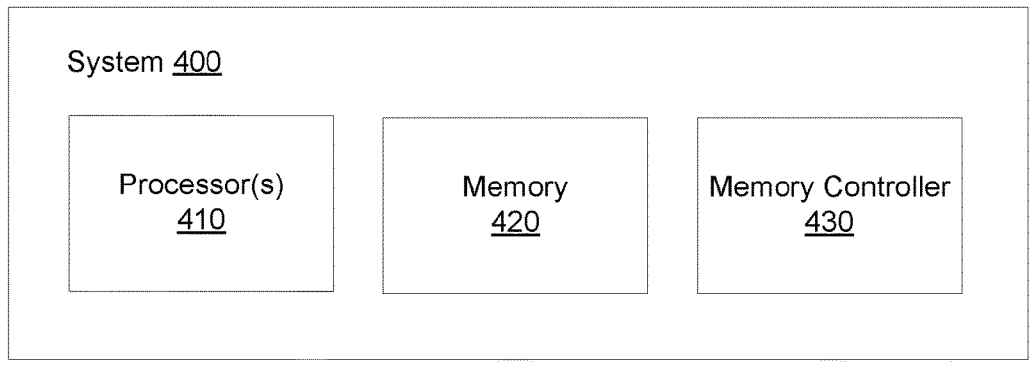
FIG. 4 illustrates a system that comprises one or more processors, a memory and a memory controller in accordance with an example embodiment.

FIG. 4 illustrates an exemplary system 400. The system 400 can include one or more processors 410, a memory 420 associated with the one or more processors 410, and a memory controller 430. The memory controller 430 can comprise logic to create a reserved memory region in a system physical address (SPA) map. The memory controller 430 can comprise logic to detect when the one or more processors 420 are brought online. The memory controller 430 can comprise logic to map the memory 410 associated with the one or more processors 420 that are brought online to the reserved memory region in the SPA map.

Figure 5:
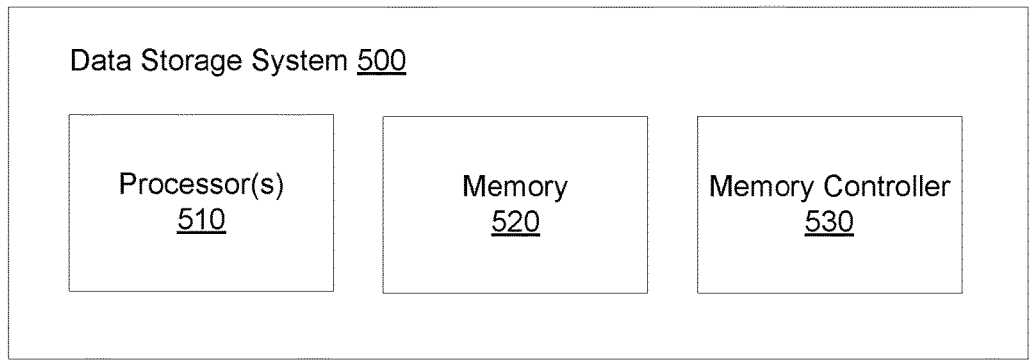
FIG. 5 illustrates a data storage system operable to perform memory mapping in accordance with an example embodiment.

FIG. 5 illustrates an exemplary data storage system 500 operable to perform memory mapping. The data storage system 500 can include one or more processors 510, a memory 520 associated with the one or more processors 510, and a memory controller 530. The memory controller 530 can comprise logic to create a reserved memory region in a system physical address (SPA) map. The reserved memory region in the SPA map can include non-existent memory (NXM). The memory controller 530 can comprise logic to detect when the one or more processors 510 are brought online. The memory controller 530 can comprise logic to map the memory 520 associated with the one or more processors 510 that are brought online to the reserved memory region in the SPA map. The SPA map can enable the volatile memory to be accessible through one or more memory address decoders in the data storage system 500.

Figure 6:
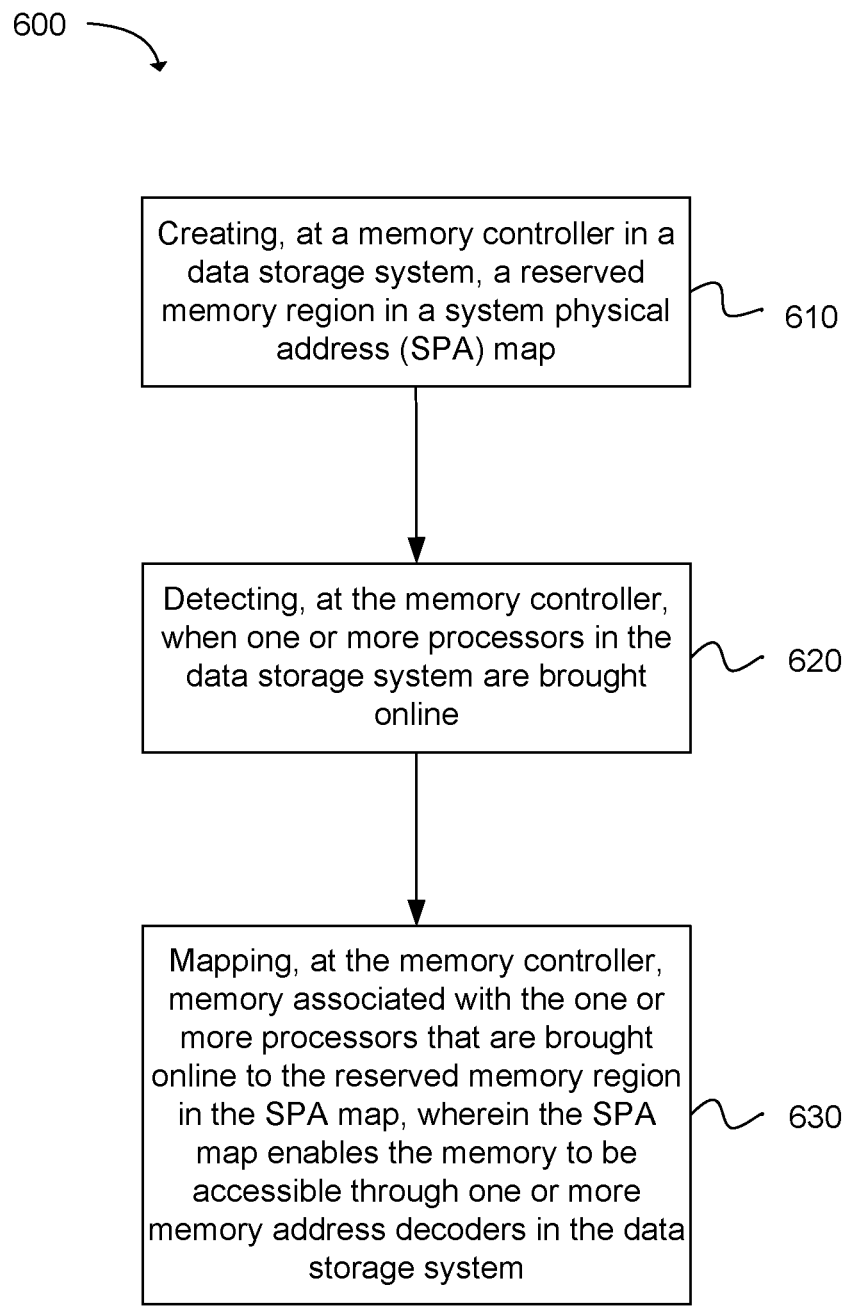
FIG. 6 depicts a flowchart of a method for mapping memory in accordance with an example embodiment.

Another example provides a method 600 for mapping memory, as shown in the flow chart in FIG. 6. The method can be executed as instructions on a machine, where the instructions are included on at least one computer readable medium or one non-transitory machine readable storage medium. The method can include the operation of: creating, at a memory controller in a data storage system, a reserved memory region in a system physical address (SPA) map, as in block 610. The method can include the operation of: detecting, at the memory controller, when one or more processors in the data storage system are brought online, as in block 620. The method can include the operation of: mapping, at the memory controller, memory associated with the one or more processors that are brought online to the reserved memory region in the SPA map, wherein the SPA map enables the memory to be accessible through one or more memory address decoders in the data storage system, as in block 630.

Figure 7:
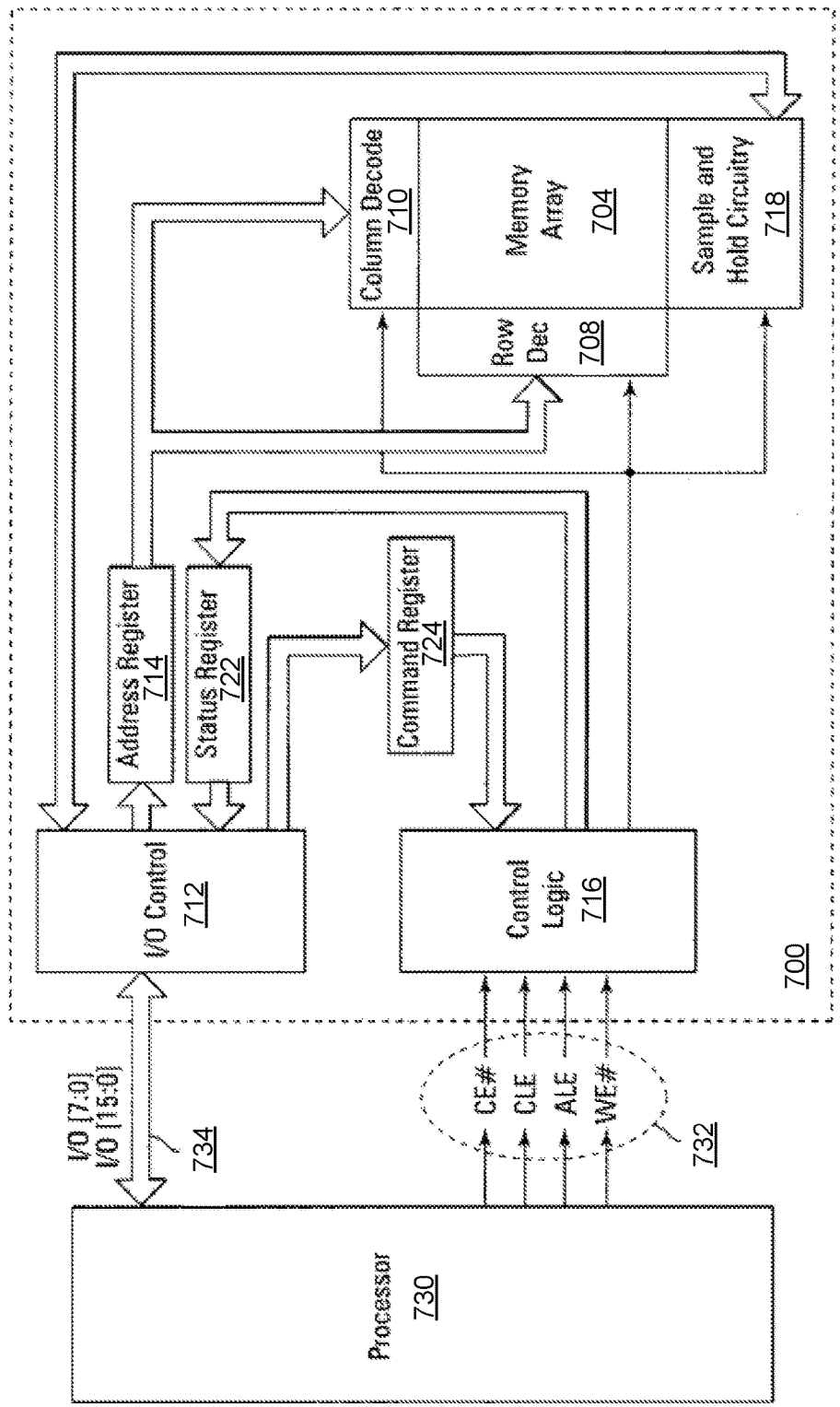
FIG. 7 illustrates a memory system diagram in accordance with an example embodiment.

FIG. 7 is a simplified block diagram of a memory device 700 according to an invention embodiment, and on which various methods can be practiced. Memory device 700 includes an array of memory cells 704 arranged in rows and columns. Although the various embodiments will be described primarily with reference to NAND memory arrays, the various embodiments are not limited to a specific architecture of the memory array 704. Some examples of specific array architectures include NOR arrays, AND arrays, PCM arrays, and virtual ground arrays. In general, however, the embodiments described herein are adaptable to any array architecture permitting generation of a data signal indicative of state of a memory cell, such as through a the threshold voltage.

A row decode circuitry 708 and a column decode circuitry 710 are provided to decode address signals provided to the memory device 700. Address signals are received and decoded to access memory array 704. Memory device 700 also includes input/output (I/O) control circuitry 712 to manage input of commands, addresses and data to the memory device 700 as well as output of data and status information from the memory device 700. An address register 714 is coupled between I/O control circuitry 712 and row decode circuitry 708 and column decode circuitry 710 to latch the address signals prior to decoding. A command register 724 is coupled between I/O control circuitry 712 and control logic 716 to latch incoming commands. Control logic 716 controls access to the memory array 704 in response to the commands and generates status information for an external processor 730 (also known as a memory controller as described earlier). The control logic 716 is coupled to row decode circuitry 708 and column decode circuitry 710 to control the row decode circuitry 708 and column decode circuitry 710 in response to the addresses.

Control logic 716 can be coupled to a sample and hold circuitry 718. The sample and hold circuitry 718 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 718 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 712 for output from the memory device, in the case of a read operation, or used for comparison during one or more verify operations in programming the memory device. It is noted that the I/O control circuitry 712 could optionally include analog-to-digital conversion functionality and digital-to-analog conversion (DAC) functionality to convert read data from an analog data signal to a digital bit pattern and to convert write data from a digital bit pattern to an analog signal such that the memory device 700 could be adapted for communication with either an analog or digital data interface.

During a programming operation, target memory cells of the memory array 704 are programmed until voltages indicative of their Vt levels match the levels held in the sample and hold circuitry 718. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 718 for transfer to an external processor (not shown in FIG. 7) either directly as analog signals or as digitized representations of the analog signals depending upon whether ADC/DAC functionality is provided external to, or within, the memory device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 718 can include caching, i.e., multiple storage locations for each data value, such that the memory device 700 can be reading a next data value while passing a first data value to the external processor, or receiving a next data value while writing a first data value to the memory array 704. A status register 722 is coupled between I/O control circuitry 712 and control logic 716 to latch the status information for output to the external processor.

Memory device 700 receives control signals at control logic 716 over a control link 732. The control signals can include a chip enable CE#, a command latch enable CLE, an address latch enable ALE, and a write enable WE#. Memory device 700 can receive commands (in the form of command signals), addresses (in the form of address signals), and data (in the form of data signals) from an external processor over a multiplexed input/output (I/O) bus 734 and output data to the external processor over I/O bus 734.

In a specific example, commands are received over input/output (I/O) pins [7:0] of I/O bus 734 at I/O control circuitry 712 and are written into command register 724. The addresses are received over input/output (I/O) pins [7:0] of bus 734 at I/O control circuitry 712 and are written into address register 714. The data can be received over input/output (I/O) pins [7:0] for a device capable of receiving eight parallel signals, or input/output (I/O) pins [15:0] for a device capable of receiving sixteen parallel signals, at I/O control circuitry 712 and are transferred to sample and hold circuitry 718. Data also can be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 7 has been simplified to help focus on the embodiments of the disclosure.

While FIG. 7 has been described with respect to sample and hold circuitry 718, it should be understood that the control logic 716 could be coupled to data latches instead of sample and hold circuitry 718 without departing from the scope of the disclosure. During a write operation, target memory cells of the memory array 704 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 7 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 734. Because the data signals represent bit patterns instead of individual bits, serial communication of an 8-bit data signal could be as efficient as parallel communication of eight signals representing individual bits.

Figure 8:
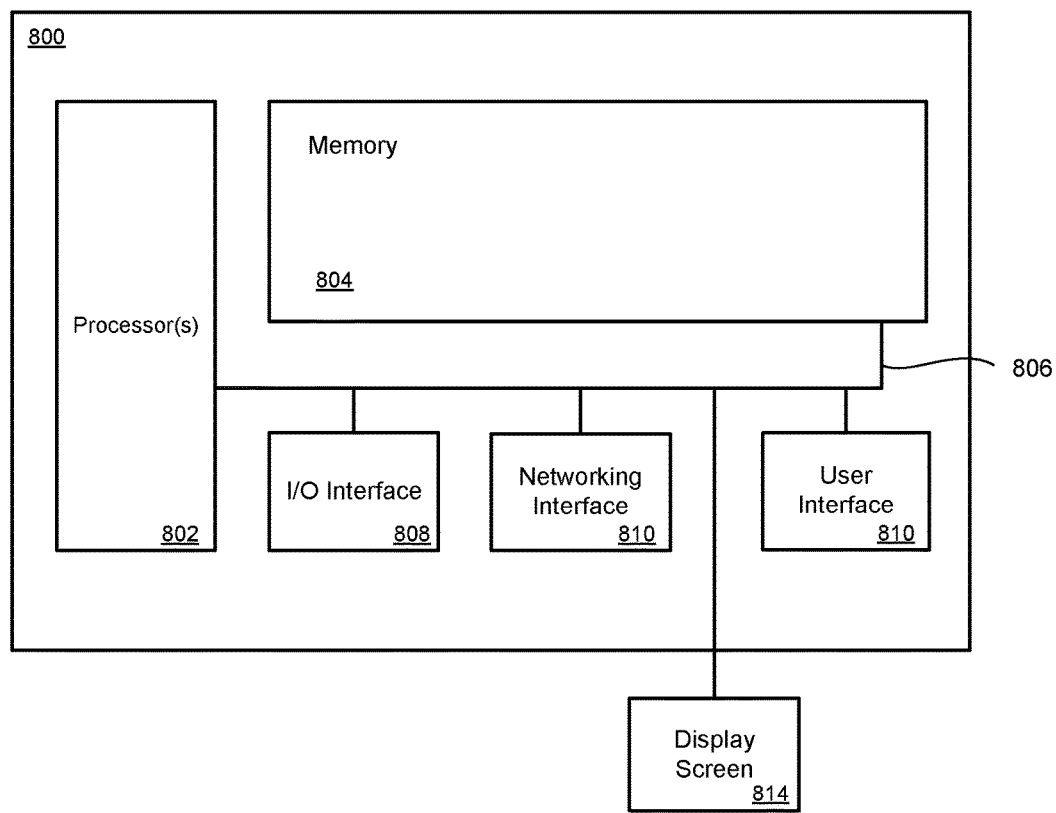
FIG. 8 illustrates a computing system that includes a data storage device in accordance with an example embodiment.

FIG. 8 illustrates a general computing system or device 800 that can be employed in various embodiments. The computing system 800 can include a processor 802 in communication with a memory 804. The memory 804 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof.

The computing system or device 800 additionally includes a local communication interface 806 for connectivity between the various components of the system. For example, the local communication interface 806 can be a local data bus and/or any related address or control busses as may be desired.

The computing system or device 800 can also include an I/O (input/output) interface 808 for controlling the I/O functions of the system, as well as for I/O connectivity to devices outside of the computing system 800. A network interface 810 can also be included for network connectivity. The network interface 810 can control network communications both within the system and outside of the system. The network interface can include a wired interface, a wireless interface, a Bluetooth interface, optical interface, and the like, including appropriate combinations thereof. Furthermore, the computing system 800 can additionally include a user interface 812, a display device 814, as well as various other components that would be beneficial for such a system.

The processor 802 can be a single or multiple processors, and the memory 804 can be a single or multiple memories. The local communication interface 806 can be used as a pathway to facilitate communication between any of a single processor, multiple processors, a single memory, multiple memories, the various interfaces, and the like, in any useful combination.

Device 800 can be powered by a battery, wireless charging, a renewal energy source (e.g., solar power or motion-based charging), or when connected to a charging port or wall outlet.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

EXAMPLES

The following examples pertain to specific invention embodiments and point out specific features, elements, or steps that can be used or otherwise combined in achieving such embodiments.

In one example there is provided an apparatus comprising:
one or more processors;
a memory associated with the one or more processors;
a memory controller comprising logic to:
create a reserved memory region in a system physical address (SPA) map;
detect when the one or more processors are brought online; and
map the memory associated with the one or more processors that are brought online to the reserved memory region in the SPA map.

In one example of a system, the memory controller further comprises logic to:
identify block read/write (R/W) regions associated with the memory of the one or more processors that are brought online; and
map the block R/W regions as write-back (WB) in the reserved memory region of the SPA map, wherein the reserved memory region enables WB regions to be grouped contiguously in the SPA map to reduce a number of memory type range registers (MTRRs) used to map the memory.

In one example of an apparatus, the memory controller further comprises logic to:
identify block control or double data rate transport (DDRT) control and status register (CSR) or mailbox (MB) regions associated with the memory of the one or more processors that are brought online; and
map the block control or DDRT CSR/MB regions as uncached (UC) in the reserved memory region in the SPA map, wherein the reserved memory region enables UC regions to be grouped contiguously in the SPA map to reduce a number of memory type range registers (MTRRs) used to map the memory.

In one example of an apparatus, the reserved memory region in the SPA map includes non-existent memory (NXM).

In one example of an apparatus, the memory comprises one or more double data rate (DDR) dual in-line memory modules (DIMMs).

In one example of an apparatus, the memory comprises volatile memory, non-volatile memory, high bandwidth memory or persistent memory.

In one example of an apparatus, the memory controller further comprises logic to: provide the SPA map that includes the reserved memory region from a platform basic input/output system (BIOS) to an operating system via a legacy memory mapping technique.

In one example of an apparatus, the reserved memory region in the SPA map pre-allocates a read/write (R/W) region and a block control or double data rate transport (DDRT) control and status register (CSR) or mailbox (MB) region to support one or more processor online events while reducing a number of memory type range registers (MTRRs) used to map the memory.

In one example of an apparatus, the reserved memory region is a reserved address range that enables the one or more processors to be brought online without relocating an existing read/write (R/W) region in the SPA map and an existing block control or double data rate transport (DDRT) control and status register (CSR) or mailbox (MB) region in the SPA map.

In one example of an apparatus, the memory controller further comprises logic to: create the reserved memory region in the SPA map using one or more dynamic random-access memory (DRAM) rules, wherein the reserved memory region is sized to encompass a maximum amount of memory potentially added to the SPA map when the one or more processors are brought online.

In one example of an apparatus, the SPA map enables the memory associated with the one or more processors that are brought online to be accessible through one or more memory address decoders.

In one example of an apparatus, the SPA map is programmed in the memory controller via a basic input/output system (BIOS).

In one example there is provided a data storage system operable to perform memory mapping, the data storage system comprising:
  one or more processors;
  a memory associated with the one or more processors;
  a memory controller comprising logic to:
    create a reserved memory region in a system physical address (SPA) map, wherein the reserved memory region in the SPA map includes non-existent memory (NXM);
    detect when the one or more processors are brought online; and
    map the memory associated with the one or more processors that are brought online to the reserved memory region in the SPA map, wherein the SPA map enables the memory to be accessible through one or more memory address decoders in the data storage system.

In one example of a data storage system, the memory controller further comprises logic to:
  identify block read/write (R/W) regions associated with the memory of the one or more processors that are brought online; and
  map the block R/W regions as write-back (WB) in the reserved memory region of the SPA map, wherein the reserved memory region enables WB regions to be grouped contiguously in the SPA map.

In one example of a data storage system, the memory controller further comprises logic to:
  identify block control or double data rate transport (DDRT) control and status register (CSR) or mailbox (MB) regions associated with the memory of the one or more processors that are brought online; and
  map the block control DDRT CSR/MB regions as uncached (UC) in the reserved memory region of the SPA map, wherein the reserved memory region enables UC regions to be grouped contiguously in the SPA map.

In one example of a data storage system, the memory comprises one or more double data rate (DDR) dual in-line memory modules (DIMMs).

In one example of a data storage system, the memory controller further comprises logic to: provide the SPA map that includes the reserved memory region from a platform basic input/output system (BIOS) to an operating system via a legacy memory mapping technique.

In one example of a data storage system, the reserved memory region in the SPA map pre-allocates a read/write (R/W) region and a block control or double data rate transport (DDRT) control and status register (CSR) or mailbox (MB) region to support one or more processor online events while reducing a number of memory type range registers (MTRRs) used to map the memory.

In one example of a data storage system, the reserved memory region is sized to encompass a maximum amount of memory potentially added to the SPA map when the one or more processors are brought online.

In one example of a data storage system, the data storage system further comprises a memory riser board with one or more double data rate (DDR) dual in-line memory modules (DIMMs), wherein the memory riser board is connected to the memory controller and enables additional memory to be added to the data storage system.

In one example of a data storage system, the data storage system further comprises one or more of:
  a display communicatively coupled to the one or more processors;
  a network interface communicatively coupled to the one or more processors; or
  a battery coupled to the one or more processors.

In one example there is provided a method for mapping memory, the method comprising:
  creating, at a memory controller in a data storage system, a reserved memory region in a system physical address (SPA) map;
  detecting, at the memory controller, when one or more processors in the data storage system are brought online; and
  mapping, at the memory controller, memory associated with the one or more processors that are brought online to the reserved memory region in the SPA map, wherein the SPA map enables the memory to be accessible through one or more memory address decoders in the data storage system.

In one example of a method for mapping memory, the method further comprises:
  identifying block read/write (R/W) regions associated with the memory of the one or more processors that are brought online;
  identifying block control or double data rate transport (DDRT) control and status register (CSR) or mailbox (MB) regions associated with the memory of the one or more processors that are brought online; and
  mapping the block R/W regions to a write-back (WB) region of the reserved memory region in the SPA map and the block control or DDRT CSR/MB regions to an uncached (UC) region of the reserved memory region in the SPA map.

In one example of a method for mapping memory, the reserved memory region in the SPA map includes non-existent memory (NXM).

In one example of a method for mapping memory, the reserved memory region in the SPA map prevents a relocation of an existing read/write (R/W) region and an existing block control or double data rate transport (DDRT) control and status register (CSR) or mailbox (MB) region when the one or more processors are brought online.

In one example of a method for mapping memory, the method further comprises creating the reserved memory region in the SPA map using one or more dynamic random-access memory (DRAM) rules.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:
1. An apparatus, comprising:
  one or more processors;
  a memory associated with the one or more processors; and
  a memory controller comprising logic to:

create a reserved memory region in a system physical address (SPA) map;
detect when the one or more processors are brought online; and
map the memory associated with the one or more processors that are brought online to the reserved memory region in the SPA map wherein the reserved memory region in the SPA map pre-allocates a read/write (R/W) region and a block control or double data rate transport (DDRT) control and status register (CSR) or mailbox (MB) region to support one or more processor online events while reducing a number of memory type range registers (MTRRs) used to map the memory.

2. The apparatus of claim 1, wherein the memory controller further comprises logic to:
identify block read/write (R/W) regions associated with the memory of the one or more processors that are brought online; and
map the block R/W regions as write-back (WB) in the reserved memory region of the SPA map, wherein the reserved memory region enables WB regions to be grouped contiguously in the SPA map to reduce a number of memory type range registers (MTRRs) used to map the memory.

3. The apparatus of claim 1, wherein the memory controller further comprises logic to:
identify block control or double data rate transport (DDRT) control and status register (CSR) or mailbox (MB) regions associated with the memory of the one or more processors that are brought online; and
map the block control or DDRT CSR/MB regions as uncached (UC) in the reserved memory region in the SPA map, wherein the reserved memory region enables UC regions to be grouped contiguously in the SPA map to reduce a number of memory type range registers (MTRRs) used to map the memory.

4. The apparatus of claim 1, wherein the reserved memory region in the SPA map includes non-existent memory (NXM).

5. The apparatus of claim 1, wherein the memory comprises one or more double data rate (DDR) dual in-line memory modules (DIMMs).

6. The apparatus of claim 1, wherein the memory comprises volatile memory, non-volatile memory, high bandwidth memory, or persistent memory.

7. The apparatus of claim 1, wherein the memory controller further comprises logic to: provide the SPA map that includes the reserved memory region from a platform basic input/output system (BIOS) to an operating system via a legacy memory mapping technique.

8. The apparatus of claim 1, wherein the memory is three-dimensional cross point memory.

9. The apparatus of claim 1, wherein the reserved memory region comprises a reserved address range that enables the one or more processors to be brought online without relocating an existing read/write (R/W) region in the SPA map and an existing block control or double data rate transport (DDRT) control and status register (CSR) or mailbox (MB) region in the SPA map.

10. The apparatus of claim 1, wherein the memory controller further comprises logic to: create the reserved memory region in the SPA map using one or more dynamic random-access memory (DRAM) rules, wherein the reserved memory region is sized to encompass a maximum amount of memory potentially added to the SPA map when the one or more processors are brought online.

11. The apparatus of claim 1, wherein the SPA map enables the memory associated with the one or more processors that are brought online to be accessible through one or more memory address decoders.

12. The apparatus of claim 1, wherein the SPA map is programmed in the memory controller via a basic input/output system (BIOS).

13. A data storage system operable to perform memory mapping, the data storage system comprising:
one or more processors;
a memory associated with the one or more processors; and
a memory controller comprising logic to:
create a reserved memory region in a system physical address (SPA) map, wherein the reserved memory region in the SPA map includes non-existent memory (NXM);
detect when the one or more processors are brought online; and
map the memory associated with the one or more processors that are brought online to the reserved memory region in the SPA map, wherein the SPA map enables the memory to be accessible through one or more memory address decoders in the data storage system, and wherein the reserved memory region in the SPA map pre-allocates a read/write (R/W) region and a block control or double data rate transport (DDRT) control and status register (CSR) or mailbox (MB) region to support one or more processor online events while reducing a number of memory type range registers (MTRRs) used to map the memory.

14. The data storage system of claim 13, wherein the memory controller further comprises logic to:
identify block read/write (R/W) regions associated with the memory of the one or more processors that are brought online; and
map the block R/W regions as write-back (WB) in the reserved memory region of the SPA map, wherein the reserved memory region enables WB regions to be grouped contiguously in the SPA map.

15. The data storage system of claim 13, wherein the memory controller further comprises logic to:
identify block control or double data rate transport (DDRT) control and status register (CSR) or mailbox (MB) regions associated with the memory of the one or more processors that are brought online; and
map the block control DDRT CSR/MB regions as uncached (UC) in the reserved memory region of the SPA map, wherein the reserved memory region enables UC regions to be grouped contiguously in the SPA map.

16. The data storage system of claim 13, wherein the memory comprises one or more double data rate (DDR) dual in-line memory modules (DIMMs).

17. The data storage system of claim 13, wherein the memory controller further comprises logic to: provide the SPA map that includes the reserved memory region from a platform basic input/output system (BIOS) to an operating system via a legacy memory mapping technique.

18. The data storage system of claim 13, wherein the reserved memory region is sized to encompass a maximum amount of memory potentially added to the SPA map when the one or more processors are brought online.

19. The data storage system of claim 13, further comprising a memory riser board with one or more double data rate (DDR) dual in-line memory modules (DIMMs), wherein the memory riser board is connected to the memory controller and enables additional memory to be added to the data storage system.

20. The data storage system of claim 13, wherein the memory is three-dimensional cross point memory.

* * * * *